United States Patent [19]

Oh

[11] Patent Number: 5,636,104

[45] Date of Patent: Jun. 3, 1997

[54] PRINTED CIRCUIT BOARD HAVING SOLDER BALL MOUNTING GROOVE PADS AND A BALL GRID ARRAY PACKAGE USING SUCH A BOARD

[75] Inventor: Sang E. Oh, Seongnam, Rep. of Korea

[73] Assignee: Samsung Electronics Co., Ltd., Suwon, Rep. of Korea

[21] Appl. No.: 512,013

[22] Filed: Aug. 7, 1995

[30] Foreign Application Priority Data

May 31, 1995 [KR] Rep. of Korea ............... 1995-14293

[51] Int. Cl.$^6$ ............... H05K 7/02; H01R 9/09
[52] U.S. Cl. ............... 361/777; 361/772; 361/774; 361/779; 174/260; 174/255; 174/261; 439/68; 439/83
[58] Field of Search ............... 174/260, 261, 174/255, 262, 263, 266; 228/180.1, 180.21, 180.22; 257/734, 737, 738, 692, 693, 697, 772, 773, 774, 777, 778, 780; 361/760, 772, 773, 774, 777, 779, 780, 783, 792–795; 439/68, 83

[56] References Cited

U.S. PATENT DOCUMENTS

| | | | |
|---|---|---|---|
| 4,940,181 | 7/1990 | Juskey, Jr. et al. | 228/180.21 |
| 5,010,389 | 4/1991 | Gansauge et al. | 257/738 |
| 5,128,746 | 7/1992 | Pennisi et al. | 257/737 |
| 5,239,198 | 8/1993 | Lin et al. | 257/693 |
| 5,329,423 | 7/1994 | Scholz | 361/760 |
| 5,355,283 | 10/1994 | Marrs et al. | 361/760 |

FOREIGN PATENT DOCUMENTS

| | | | |
|---|---|---|---|
| 60-241228 | 11/1985 | Japan | 257/738 |
| 62-266857 | 11/1987 | Japan | 257/738 |
| 63-239873 | 10/1988 | Japan | 257/738 |
| 4-72792 | 3/1992 | Japan | 361/783 |

OTHER PUBLICATIONS

IBM Technical Disclosure Bulletin "Indium–Lead–Indium Chip Joining" by Dawson et al. vol. 11 No. 11. Apr. 1969.

*Primary Examiner*—Donald Sparks
*Attorney, Agent, or Firm*—Cushman Darby & Cushman IP Group of Pillsbury Madison & Sutro, L.L.P.

[57] ABSTRACT

A ball grid array package includes a semiconductor chip 4, a circuit board 21 including a plurality of pattern layers of conductive wiring and dielectric layers interposed between the pattern layers which include the first pattern layer 22 and the second pattern layer 23. Electrically conductive wires are provided for interconnecting the semiconductor chip and the conductive wiring, mold resin 4 encapsulates the semiconductor chip and the wiring, and a plurality of solder balls 5 are adhered to a bottom surface of the circuit board 21 and electrically interconnected to the wires via the pattern layers. The surface mounting pad 22 is formed on the first pattern layer and a second conductive pad is formed on the second pattern layer. The first pattern layer is an outermost layer of the circuit board and the second pattern layer is just inside of the first layer so that the first and the second conductive pads form a solder ball groove mounting pad wherein a bottom surface of the mounting pad is the second conductive pad and the first conductive pad extends to the surface of the mounting pad.

3 Claims, 3 Drawing Sheets

PRINTED CIRCUIT BOARD HAVING SOLDER BALL MOUNTING GROOVE PADS AND A BALL GRID ARRAY PACKAGE USING SUCH A BOARD

BACKGROUND OF THE INVENTION

1. Technical Field

This invention relates generally to semiconductor devices, and more particularly to Ball Grid Array packages suitable for use in Printed Circuit Boards. The Ball Grid Array packages have solder ball mounting groove pads for facilitating the locating of solder balls and for reinforcing the bonding strength between the solder balls and the circuit board, resulting in increased resistance to cracking of the solder balls.

2. Description of the Prior Art

Miniaturization of semiconductor device size has been an important topic in the art, when the device requires more I/O pins according to the increase of device density. The multi I/O pins, however, require the lead pitch of the package device to be smaller. As a result, the leads become more fragile to external impacts, the performance of the final package device may be degraded due to parasitic parameters of the thinner package leads, and more attention should be paid in management of the package device.

Ball Grid Array (hereinafter abbreviated as 'BGA') packages known from e.g., U.S. Pat. No. 5,355,283 are new and upgraded versions of PGA (Pin Grid Array) packages. The BGA packages are more suitable for use in high I/O pin devices than PGA packages, since then can avoid negative inductive parameters of the long pin leads of the PGA package while maintaining the efficiency of the I/O pins of the Grid Array packages. Further, the BGA package is capable of high mounting density since it can, unlike the PGA package, utilize a Surface Mounting Technique (SMT).

FIG. 1 shows a conventional BGA package 10. A semiconductor chip 2 on which a predetermined circuit pattern is formed through a wafer process is mounted onto the substrate 1, for example, Printed Circuit Board (PCB). The electrical interconnection between the chip 2 and the PCB 1 is achieved by bonding wires 3. An encapsulation resin 4 such as an Epoxy Molding Compound is used to protect the chip and the bonding wires from the external environment. On the bottom surface of the PCB 1 are attached a plurality of solder balls 5. Because the solder balls 5 and the semiconductor chip 2 are electrically interconnected by a predesigned wiring pattern within the PCB 1 (not shown), both electrical signals from external devices to the chip 2 and data signals from the chip 2 can pass through the solder balls 5. Particularly, if the solder balls 5 were used as supply power or ground power terminals, the shorter electrical length of the solder balls 5 would reduce the inductance and resistance of the package leads. The solder balls 5 further contribute to the heat dissipation from the semiconductor chip 2.

FIG. 2A is an enlarged and inverted view of portion "A" in FIG. 1. It can be seen that the solder balls 5 are to be mounted onto the bottom surface of the PCB 1. A number of pads 7 which are electrically and mechanically coupled to the solder balls 5 are formed on the back of the PCB 1. On the entire surface of the back of the PCB 1 excepting the areas for the solder ball pads 7 is deposited solder resister 8 (also referred to as 'solder mask') in order to prevent a solder bridge between solder balls and to protect the back face of the PCB 1 and the wiring pattern. After a flux 6 is coated on the pad 7, solder balls 5 are mounted on a position denoted by an arrow in FIG. 2A. The mounted solder balls 5 will adhere to the pad 7 as shown in FIG. 2B through a well-known reflow solder process.

FIG. 3 is a cross sectional view of the conventional BGA package mounted onto a main board 9 of a system. The system's main board 9 has a solder ball receiving pad 11 which is, for example, constructed as disclosed in U.S. Pat. No. 4,940,181 for receiving the solder balls 5. By applying additional reflow solder process to the BGA package 10, it is completely mounted onto the main board 9.

However, thermal stress will be generated in the solder balls 5 and the mating components thereto during these reflow solder processes. In the worst case, this stress can cause cracks of solder balls 5 not only at the position "B" as shown in FIG. 2B, i.e., at the necks of the mounted solder balls 5, but also at the interface (denoted as 'C' in FIG. 3) of the solder balls 5 with the main system board 9.

The weakness of the bonding force of the solder balls 5 resulting from the crack can be considered in two ways. When the solder balls 5 are detached from the system board 9, this failure can be repaired by re-mounting the BGA package 10 on the board 9. In this case, however, the solder balls 5 will undergo twice the amount of stress by twice being subjected to the reflow solder precesses. When the solder balls 5 are detached from the PCB substrate 1, it is impossible to remount the BGA package 10 onto the main board 9.

Further, since the solder balls 5 are attached, as shown in FIG. 2B, to the pad 7 on which solder resist 8 is not deposited, the bonding strength of the solder balls 5 to the pads 7 becomes weak and the solder balls 5 are easy to detach when even a small amount of contamination substance penetrates into the bonding interface. Moreover, it is a troublesome operation to accurately locate and align each of the solder balls 5 onto the PCB 1, because the pad 7 of the conventional BGA package 10 has a flat upper surface.

SUMMARY OF THE INVENTION

Accordingly, it is an object of the present invention to provide a highly reliable BGA package having a structure for improving the bonding strength of solder balls to a circuit board.

It is another object of the present invention to improve alignment accuracy of the solder balls when mounted onto the PCB substrate, resulting in a reduction in the number locating failures and in an increase in the productivity of the BGA packages.

In order to achieve these objects, the PCB of the present invention comprises solder ball mounting groove pads at locations for receiving the solder balls. When the solder balls are mounted to this PCB by a reflow soldering process, the former is, in part, melted down into the groove pad so that the necks of the joining portion, which serve as seeds of the solder balls crack in the prior art, can be eliminated, which results in a considerable increase in the bonding strength of the solder balls to the board.

BRIEF DESCRIPTION OF THE DRAWINGS

The details of the present invention will be described in connection with the accompanying drawings, in which.

DETAILED DESCRIPTION OF PREFERRED EMBODIMENTS

Figure 4:
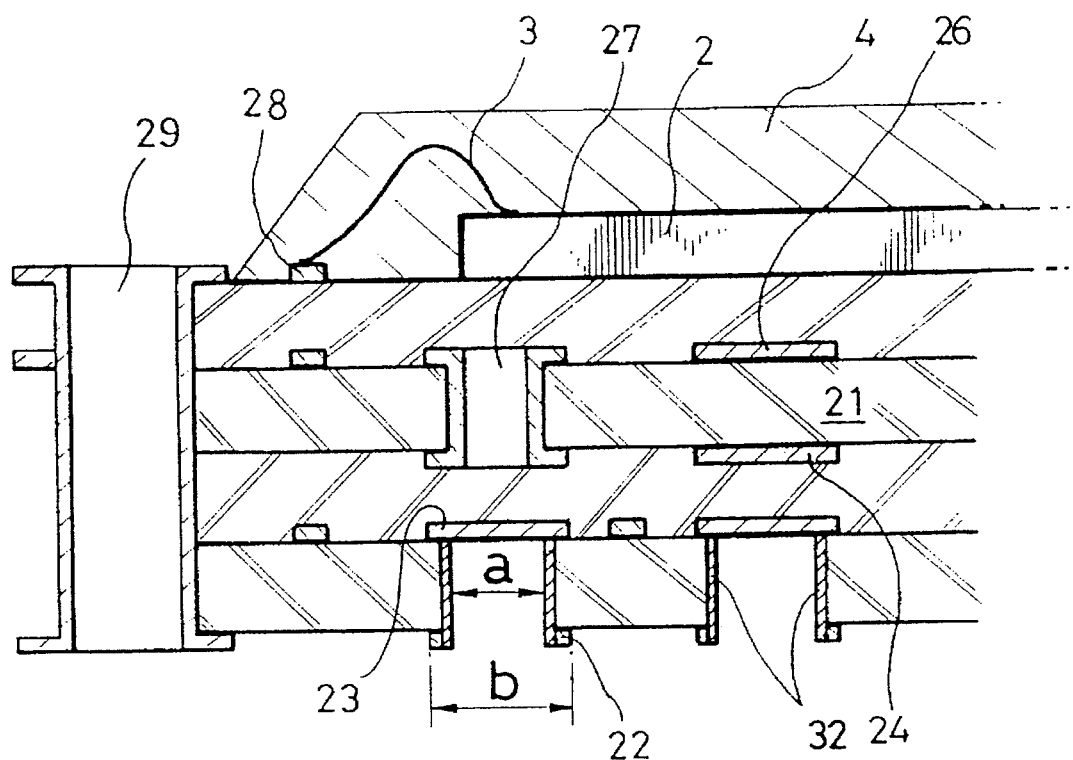
FIG. 4 is a cross sectional view of a BGA package using a PCB constructed according to the present invention.

FIG. 4 shows a BGA package having a PCB 21 according to the present invention. The PCB 21 is multi layered and the copper patterned layers 24, 26 and 28 having a predefined wiring pattern are electrically interconnected by either via holes 27 or through holes 29. Solder balls will be placed on the mounting pads. The term "mounting pad" used in the detailed description and the accompanying claims means a groove structure in which a pad is formed on its bottom (referred to as 'internal pad 23') and another pad surrounds the upper periphery thereof (referred to as 'surface pad 22') is formed penetrating the bottom or lowest layer of the PCB 21. The internal pad 23 is formed in the second lowest layer made of, for example copper, which second lowest layer being contact with the lowest layer.

The diameter 'a' of the groove is determined based on the size of the solder ball, and the overall length 'b' of the mounting pad is dependent upon the width of the surface pad, i.e., 'b-a', to which the solder balls will be melted and adhered during the reflow solder process. These variables 'a' and 'b' are very important in design of the wiring pattern of the PCB, because they will define how many lines can pass through between two adjacent solder ball mounting pads 22, 23. In addition, the interlayer distance of the multilayered PCB should be carefully considered, since the distance i.e., the thickness of a dielectric layer (for example, a prepreg layer) interposed between the circuit layers having the surface pad 22 and the internal pad 23 will determine the depth of the solder ball mounting pad, and the configuration of the solder ball after reflow solder process which influences the crack of the solder ball. The size of the solder ball pad has influence on precise alignment of the solder balls onto the PCB 21.

In a preferred embodiment, the solder ball mounting pad has a diameter 'a' of 760 um and the diameter 'b' of 800 um. And a copper layer of 18 um thick is used for the surface pad 22, another copper layer of 36 um thick is used for the internal pad 23, and a dielectric of 0.1 mm thick is used for interlayer material. The width 'a' of the groove of the mounting pad is approximately 500 um, the overall length of the mounting pad is, in consideration of 1.27 mm pitch of the solder ball, set to be approximately 760 um. Accordingly, the size of the surface pad 22 will be about 80 um.

While if the size of the groove resulted from the internal pad 23 and the surface pad 22 is made greater than that of the solder ball, the feature of the solder ball after the reflow soldering will be improved, the large size groove can not be applied on behalf of only the feature for the solder ball, because when the groove size becomes larger, the patterned wires of the PCB which must pass through between two adjacent solder balls having a small solder ball pitch (specifically, this pitch is defined as 1.0/1.27/1.5 mm) is limited. In present, the smallest solder ball has a radius of 50 um.

Figure 5:
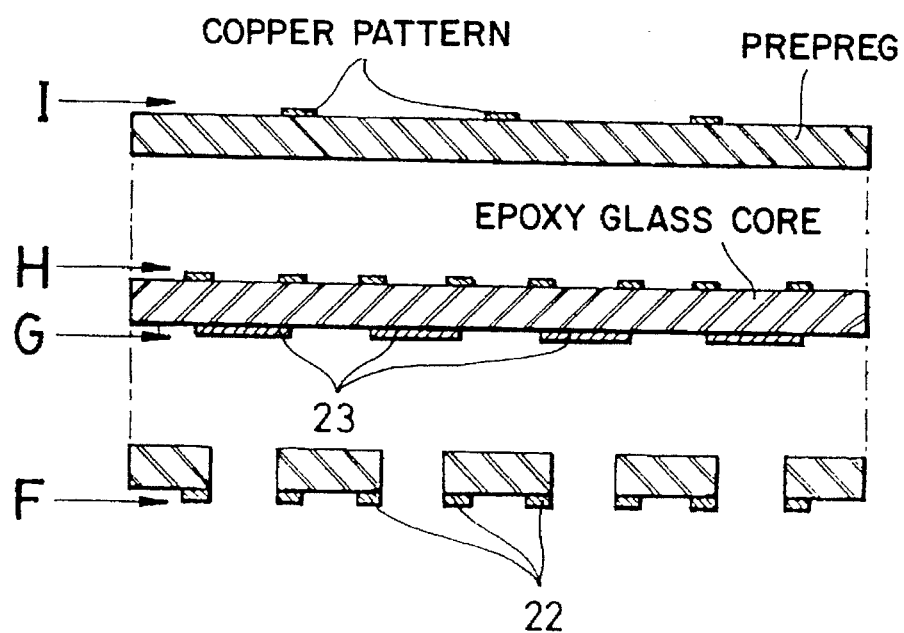
FIG. 5 shows a structure of the PCB according to the present invention.

FIG. 5 shows the structure of the PCB 21 according to the invention. The PCB described in the Figure comprises multi layers F, G, H and I, and between each of two adjacent circuit layers are sandwitched by dielectric substances such as prepreg. The circuit layers F, G, H and I are manufactured by depositing or plating copper material onto substrates such as epoxy glass, and by patterning the deposited copper layer using etching method to be desired wiring patterns.

In FIG. 5, it can be seen that the internal pad 23 is formed on a layer G and the surface pad 22 is denoted as a layer F. The detailed description of the manufacturing process of the PCB will not be given here, as it is not greatly different from the conventional art.

However, the only difference of the present invention is as follows: At the positions corresponding to the mounting points of the solder balls, the circuit layer F has holes punched through it which have a size 'a' of FIG. 4 by, e.g., drilling. Then, a copper pattern of the surface pad 22 is formed. In the layer G, the copper pattern of the internal pad 23 is formed on areas corresponding to the holes of the layer G. Of course, the dielectric prepreg layer between the layers F and G is also perforated and not coated on the internal pad 23. The PCB of the present invention is completed by compressing the layers G and F having holes and copper patterns above together with the layers H, I and the dielectric prepregs.

Figure 6A:
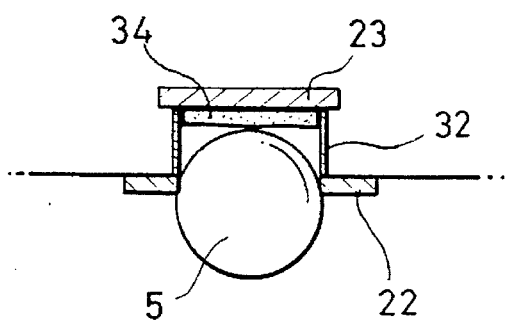
FIG. 6A is an enlarged view of a solder ball mounting pad of the PCB according to the present invention on which a solder ball is placed.

FIG. 6A shows the solder ball mounting pad of the PCB according to the present invention on which a solder ball is placed. Before the solder ball 5 is placed onto the solder ball pad 22, 23 formed from the precess of FIG. 5, a copper film 32 is plated on the side walls of the dielectric layer in order to make it easy for the solder ball to adhere to the dielectric layer during the subsequent reflow solder process. A flux 34 is deposited on the internal pad 23 and the solder ball 5 is placed. The solder ball 5 is so well aligned by virtue of the mounting pad 22, 23 that falling apart of the solder ball caused by any misalignment can be prevented.

Figure 1:
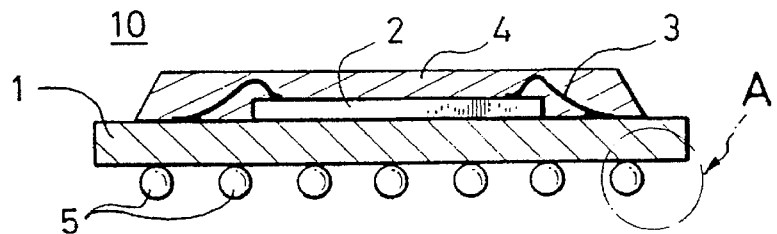
FIG. 1 is a cross sectional view of a prior art Ball Grid Array package.
Figure 2A:
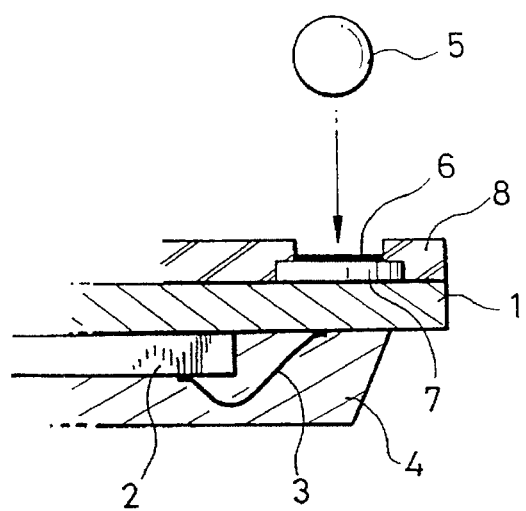
FIG. 2A is an enlarged view of "A" in FIG. 1, and shows the structure of the bottom surface of a Printed Circuit Board on which a solder ball is to be mounted.
Figure 2B:
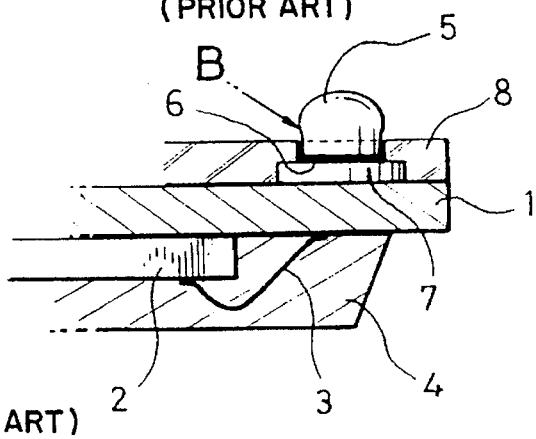
FIG. 2B is an enlarged view of "A" in FIG. 1, and shows the structure in which the solder ball is adhered to the PCB.
Figure 3:
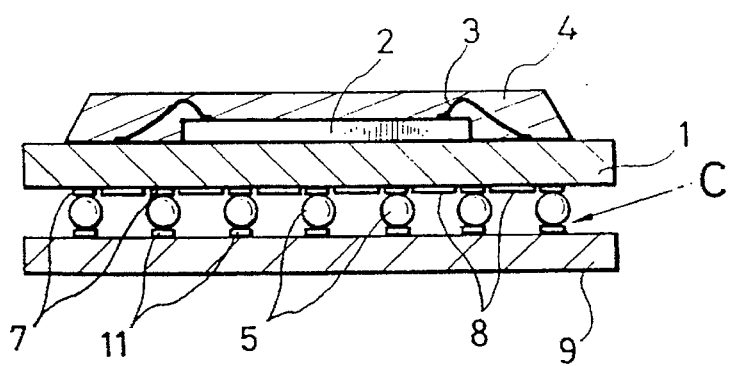
FIG. 3 is a cross sectional view of the prior art BGA package mounted on a system main board.
Figure 6B:
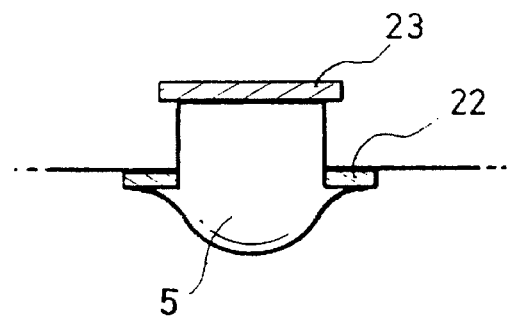
FIG. 6B is an enlarged view of the solder ball mounting pad of the PCB according to the present invention on which the solder ball is, in part, melted down into the pad.

FIG. 6B is an enlarged view of the solder ball melted, in part, down into the solder ball mounting pad. In comparison with the conventional structure as shown in FIG. 2B, the solder ball of FIG. 6B is so melted down into the pad 23 and extended to the surface pad 22 that the bonding strength of the solder ball is much stronger.

The mushroom like solder ball 5 also contributes to the reduction of cracks caused by difference of coefficients of the thermal expansion when the BGA package is mounted onto the system mother board. In addition, the height of the mounted solder ball can be lowered by the thickness of the dielectric layer of the PCB in which the solder ball is entered.

Figure 7:
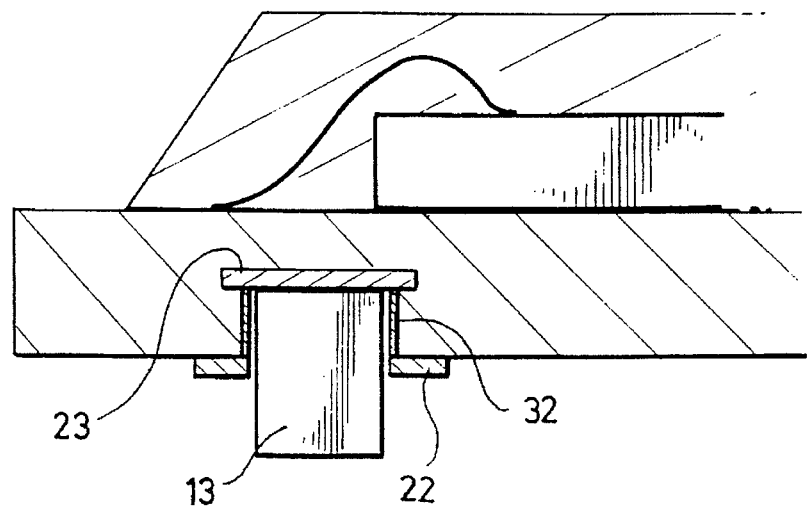
FIG. 7 is a cross sectional view of another embodiment of the BGA package, in which a metal column made of copper or alloy as a substitute for the solder ball is mounted onto the PCB according to the present invention.

FIG. 7 is a cross sectional view of another embodiment of the BGA package, in which a metal column 13 made of copper or alloy, as a substitute for the solder ball, is mounted onto the PCB according to the present invention. This embodiment has an advantage in view of solder joint crack, however the cost will be higher in consideration of the process for manufacturing of the metal column, etc.

As explained above, in the BGA package according to the present invention, the solder balls are more steadily adhered to both the PCB and the system's mother board by forming groove pads made from internal pads and surface pads on the back of the PCB, and by reflow soldering the solder balls placed on the groove pads.

What we claim is:

1. A ball grid array package, comprising:

a semiconductor chip;

a circuit board including a plurality of pattern layers of conductive wiring and dielectric layers interposed between adjacent two pattern layers, said plurality of pattern layers including a first pattern layer and a second pattern layer;

electrically conductive wires for interconnecting the semiconductor chip and the circuit board;

mold resin for encapsulating said semiconductor chip and said wires; and a plurality of solder balls adhered to a bottom surface of the circuit board and electrically interconnected to said wires via said pattern layers; wherein a first conductive pad is formed on the first pattern layer and a second conductive pad is formed on the second pattern layer, said first pattern layer is an outermost layer of the circuit board and said second pattern layer is a second outermost layer of the circuit board so that the first and the second conductive pads form grooves for receiving the solder balls, wherein a bottom surface of each of the grooves is the second conductive pad and the first conductive pad extends to a surface of the groove.

2. The ball grid array package of claim 1, wherein a depth of the groove is equal to a thickness of the dielectric layer interposed between the first pattern layer and the second pattern layer, and a diameter of the groove is equal to or smaller than a diameter of said solder ball.

3. The ball grid array package of claim 1, wherein said solder ball is a metal column having a rectangular cross section made of copper or copper alloy.

* * * * *